(12) United States Patent
Zeng et al.

(10) Patent No.: US 9,171,775 B2
(45) Date of Patent: Oct. 27, 2015

(54) EVAPORATION-ASSISTED HEAT DISSIPATION APPARATUS

(71) Applicant: ShenZhen Treasure City Technology Co., LTD., Shenzhen (CN)

(72) Inventors: Xiang-Kun Zeng, Shenzhen (CN); Er-Wei Lu, Shenzhen (CN); Zhi-Qiang Zuo, Shenzhen (CN)

(73) Assignee: ShenZhen Treasure City Technology Co., LTD., ShenZhen (CN)

( * ) Notice: Subject to any disclaimer, the term of this patent is extended or adjusted under 35 U.S.C. 154(b) by 176 days.

(21) Appl. No.: 13/972,204

(22) Filed: Aug. 21, 2013

(65) Prior Publication Data

US 2014/0144608 A1 May 29, 2014

(30) Foreign Application Priority Data

Nov. 23, 2012 (CN) .......................... 2012 1 0481188

(51) Int. Cl.

| *F28B 1/00* | (2006.01) |
|---|---|
| *H01L 23/427* | (2006.01) |
| *G06F 1/20* | (2006.01) |
| *F28D 3/02* | (2006.01) |
| *H01L 23/467* | (2006.01) |
| *H01L 23/473* | (2006.01) |

(52) U.S. Cl.
CPC .............. *H01L 23/427* (2013.01); *G06F 1/203* (2013.01); *G06F 2200/201* (2013.01); *H01L 23/467* (2013.01); *H01L 23/4735* (2013.01); *H01L 2924/0002* (2013.01)

(58) Field of Classification Search
CPC . G06F 1/203; G06F 2200/201; H01L 23/427; H01L 23/467; H01L 23/4735; H01L 2924/0002; H01L 2924/00; F28D 3/04; F28B 1/02
USPC .......................................................... 165/117
See application file for complete search history.

(56) References Cited

U.S. PATENT DOCUMENTS

| 6,349,760 | B1 * | 2/2002 | Budelman | 165/80.4 |
|---|---|---|---|---|
| 6,955,063 | B2 * | 10/2005 | Adiga et al. | 62/259.2 |
| 8,037,926 | B2 * | 10/2011 | Martin et al. | 165/80.4 |
| 8,329,325 | B2 * | 12/2012 | Brodie et al. | 429/62 |
| 2007/0103868 | A1 * | 5/2007 | Yazawa | 361/699 |
| 2009/0050294 | A1 * | 2/2009 | Fedorov | 165/80.3 |
| 2014/0138062 | A1 * | 5/2014 | Zeng et al. | 165/104.31 |

* cited by examiner

*Primary Examiner* — Tho V Duong
(74) *Attorney, Agent, or Firm* — Novak Druce Connolly Bove + Quigg LLP

(57) ABSTRACT

An evaporation-assisted heat dissipation apparatus includes a heat sink, a fan, and a spraying member. The spraying member includes a water tank, a water transmitting tube, and a plurality of water output tubes. The water tank accommodates a heat-dissipating liquid which flows to the tops of the plurality of water output tubes via the water transmitting tube. The convex meniscus which is formed at the top of each of the plurality of water output tubes is atomized and blown toward the heat sink by the fan and the droplets attach on the heat sink. The droplets are evaporated from the heat sink and remove heat from the heat sink by doing so.

16 Claims, 6 Drawing Sheets

EVAPORATION-ASSISTED HEAT DISSIPATION APPARATUS

BACKGROUND

1. Technical Field

The present disclosure relates to a spray type heat dissipation apparatus.

2. Description of Related Art

Electronic devices in computers, such as central processing units (CPUs), generate heat during operation. Excessive amounts of heat causes deterioration in the operational stability of the devices and may cause damages to associated electronic devices. Thus, heat must be removed quickly to ensure normal operation of the CPU. A typical heat dissipation apparatus includes a heat sink mounted on a CPU to remove heat, and a fan fixed on the heat sink to generate airflow through the heat dissipation apparatus. The fan includes a plurality of fan blades and a motor in the center of the fan for rotating the fan blades. The typical heat dissipation apparatus occupies an large space in computers which may be undesirable.

Therefore, there is a need for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
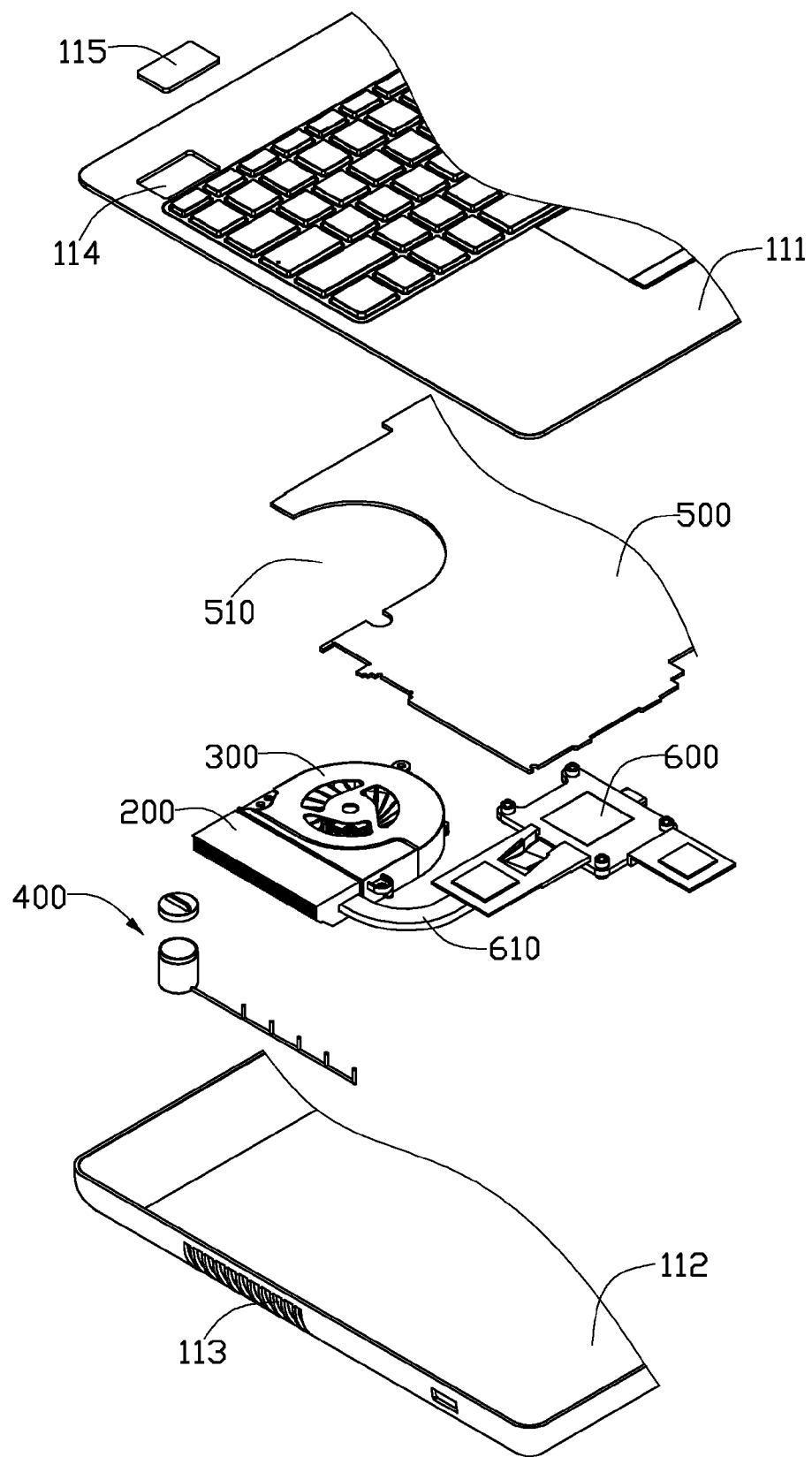
FIG. 1 is an isometric, exploded view of an embodiment of a spray type heat dissipation apparatus.
Figure 2:
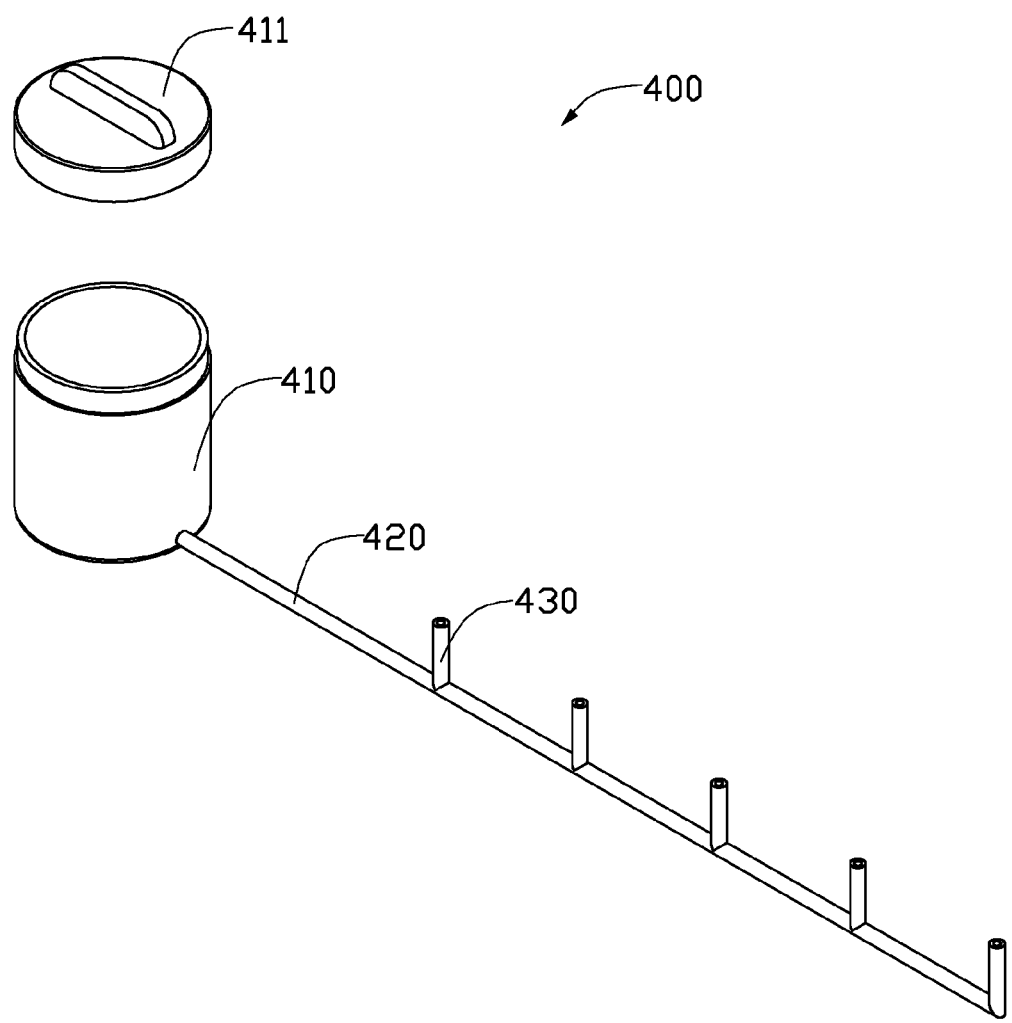
FIG. 2 is an isometric, exploded view of the spraying member of FIG. 1.
Figure 3:
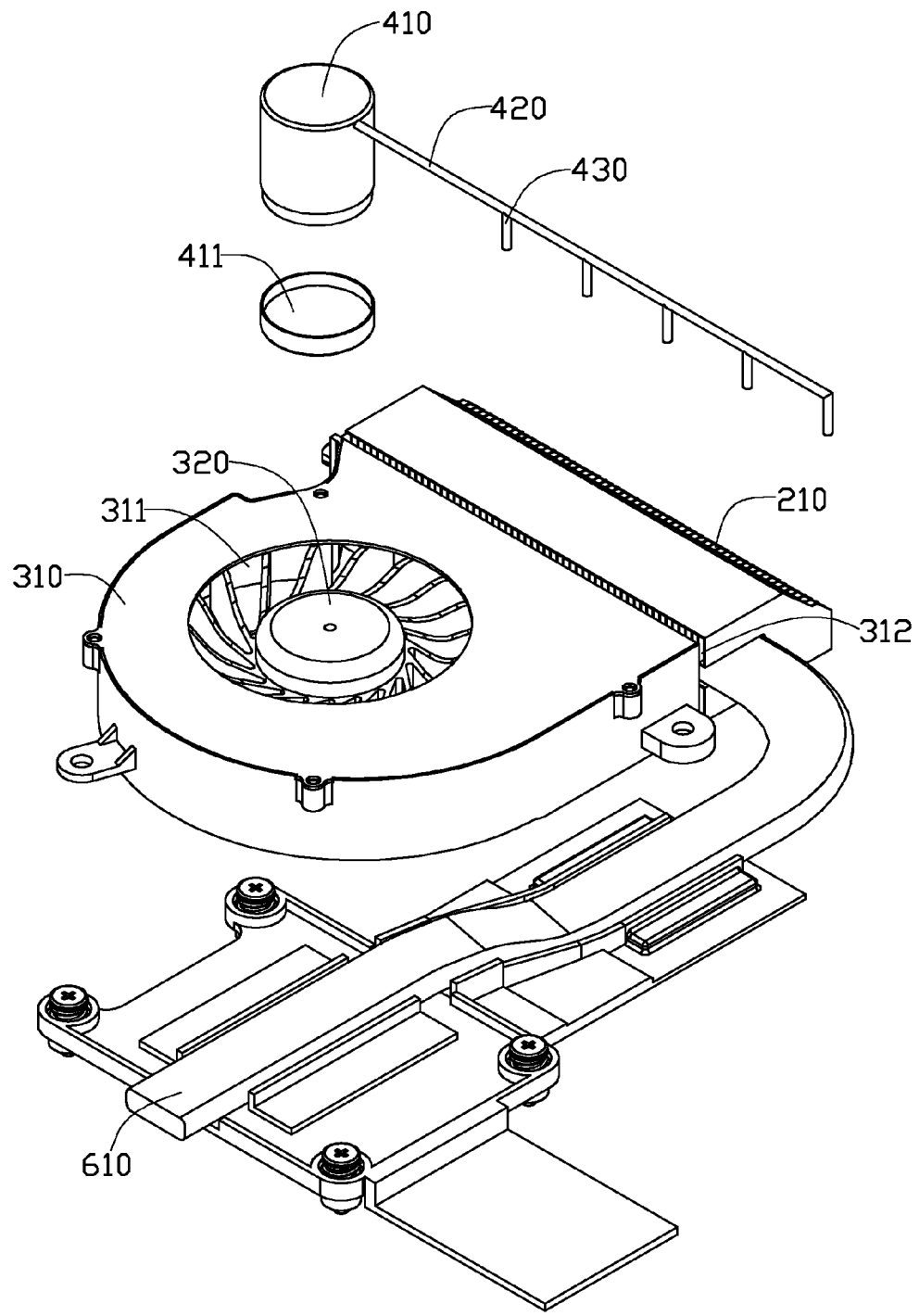
FIG. 3 is an isometric, exploded view of the heat sink, the fan, the spraying member, the heat source, and the heat pipe of FIG. 1.
Figure 4:
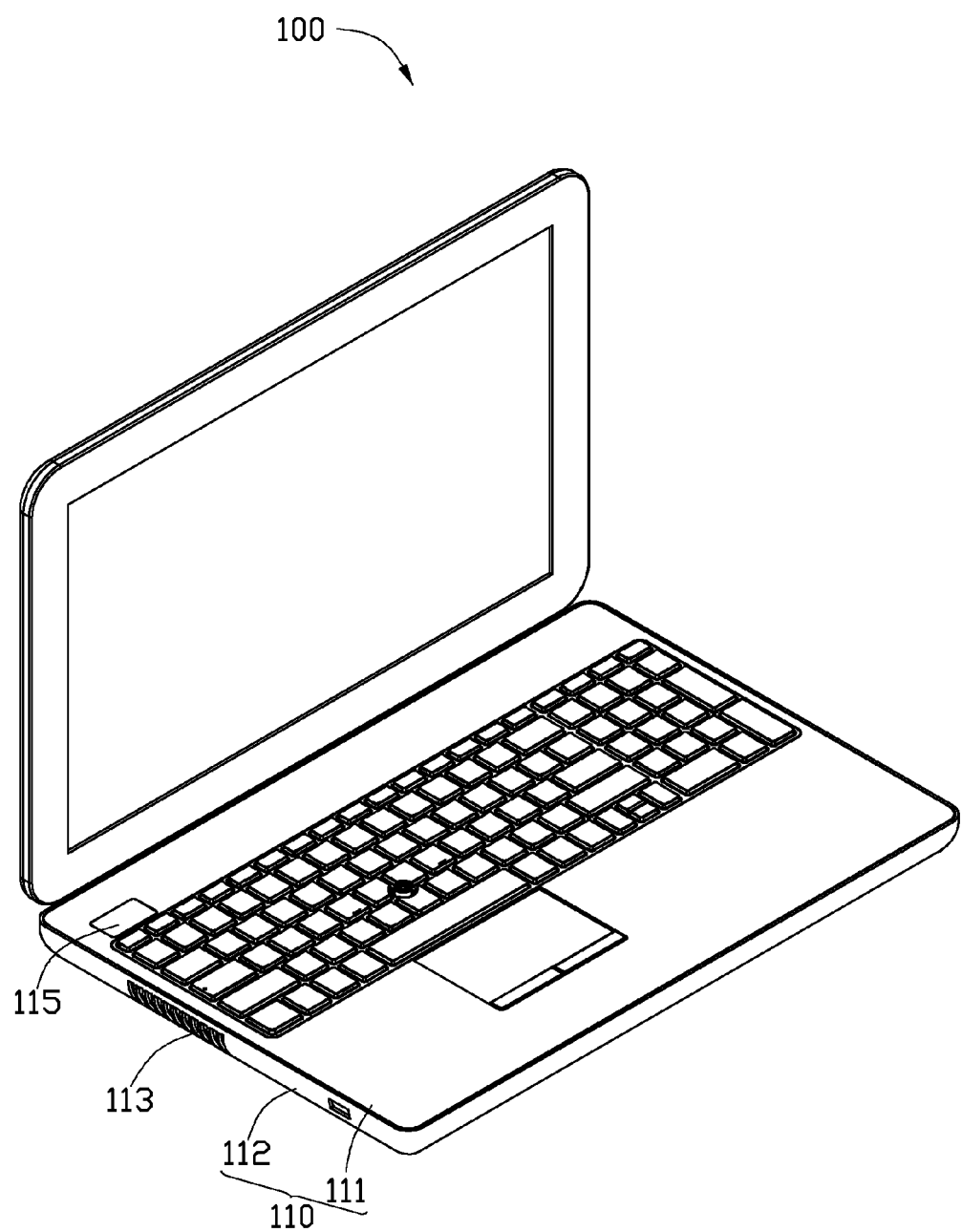
FIG. 4 is an assembled view of the spray type heat dissipation apparatus of FIG. 1.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

FIGS. 1 to 4 show a spray type heat dissipation apparatus for an electronic device 100. The electronic device 100 includes an enclosure 110. The enclosure 110 includes an enclosure base 111 and an enclosure cover 112. The enclosure base 111 is configured for mounting a heat sink 200, a fan 300, a spraying member 400, and a circuit board 500. In one embodiment, the electronic device 100 is a notebook computer.

The heat sink 200 includes a plurality of parallel fins 210. The fan 300 includes a shell 310 and a rotatable fan blade module 320. An air inlet opening 311 is defined in a top plate of the shell 310. The shell 310 further has an air outlet opening 312 defined at one side thereof. The air inlet opening 311 allows air to flow into the fan 300 in a direction which is in line with a rotating axle of the fan blade module 320. The air outlet opening 312 allows air to flow out of the fan 300 horizontally. The air outlet opening 312 is aligned to one side of the plurality of parallel fins 210. A plurality of slots 113 are defined in one side of the enclosure base 111. Another side of the plurality of parallel fins 210 is aligned to the plurality of slots 113.

The spraying member 400 includes a water tank 410, a water transmitting tube 420 extending from a bottom of the water tank 410, and a plurality of water output tubes 430 perpendicularly extending upwards from the water transmitting tube 420. The plurality of water output tubes 430 are located between the air outlet opening 312 and the plurality of parallel fins 210. An opening 114 is defined in the enclosure cover 112. A first cover panel 115 is located on the opening 114. A second cover panel 411 is located on the water tank 410. The water tank 410 extends to outside of the enclosure 110 via the opening 114. In one embodiment, the water tank 410 is a cylinder. The water tank 410 contains a plurality of water, alcohol, or other type of liquid for dissipating heat.

The circuit board 500 is configured for mounting a heat source 600. The heat accumulated on the heat source 600 is transmitted to the plurality of parallel fins 210 via a heat pipe 610. A cutout 510 is defined in the circuit board 500. The fan 300 is accommodated in the cutout 510.

In assembly, the heat source 600 is mounted on the circuit board 500. A first terminal of the heat pipe 610 contacts the heat source 600. A second terminal of the heat pipe 610 passes through and contacts the plurality of parallel fins 210. The fan 300, the spraying member 400, and the circuit board 500 are mounted on the enclosure base 111. The enclosure cover 112 is mounted on the enclosure base 111.

Figure 5:
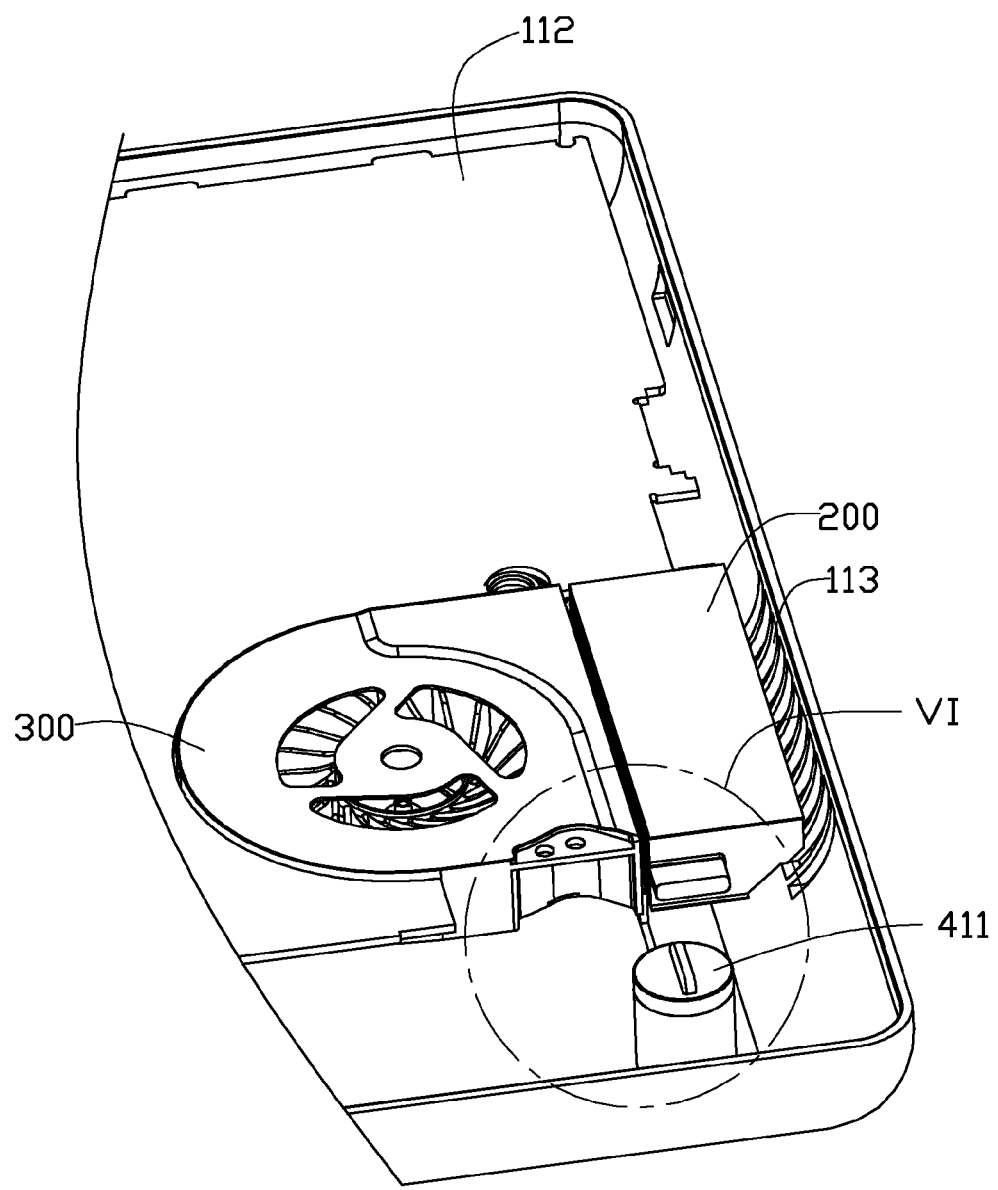
FIG. 5 is a partial assembled view of the spray type heat dissipation apparatus of FIG. 1.
Figure 6:
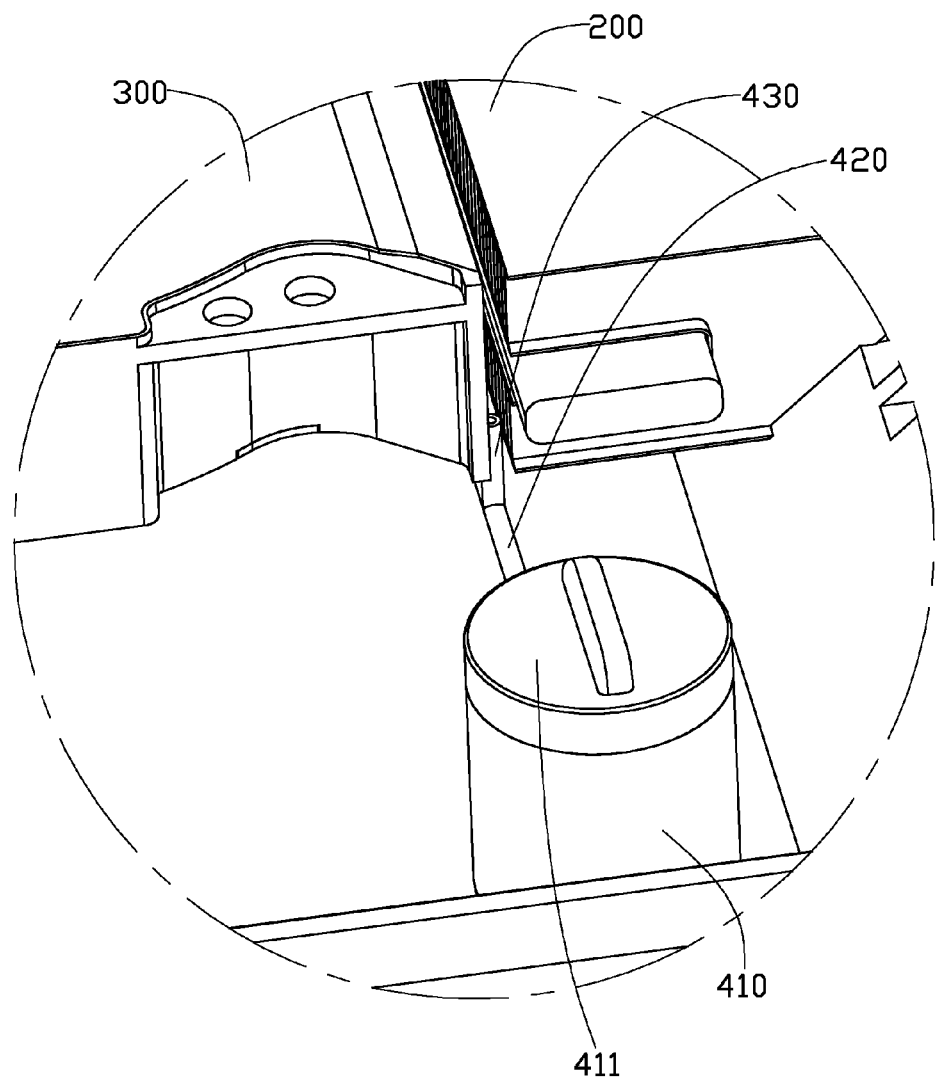
FIG. 6 is an enlarged view of a circled portion VI of FIG. 5.

FIGS. 5 and 6 show that in operation, the heat source 600 generates large amounts of heat when the electronic device 100 is powered on. The cool air outside the electronic device 100 is sucked into the fan 300 via the air inlet opening 311. The cool air is blown out of the fan 300 through the air outlet opening 312 and blown toward the heat sink 200 and the heat pipe 610. In order to improve heat dissipation efficiency, the first cover panel 115 and the second cover panel 411 are removed. The water tank 410 is filled with water or alcohol. The water or alcohol in the water tank 410 flows out to the plurality of water output tubes 430 via the water transmitting tube 420. A plurality of convex meniscus are formed at the plurality of water output tubes 430 as a tensile force on the surface of the water or alcohol. The cool air blown out from the air outlet opening 312 is directed toward the plurality of water output tubes 430. The plurality of convex meniscus at the plurality of water output tubes 430 are atomized into a mist of droplets. The cool air blows the mist of droplets onto the plurality of parallel fins 210. The mist of droplets attaches on the plurality of parallel fins 210 and, in the process of being evaporated, removes the heat accumulated on the heat sink 200, the heat-carrying air is then blown out of the enclosure 110 via the plurality of slots 113. Therefore, the heat dissipation efficiency of the heat dissipation apparatus is significantly improved.

Even though numerous characteristics and advantages of the present disclosure have been set forth in the foregoing description, together with details of the structure and function of the disclosure, the disclosure is illustrative only, and changes may be made in detail, especially in the matters of shape, size, and the arrangement of parts within the principles of the disclosure to the full extent indicated by the broad general meaning of the terms in which the appended claims are expressed.

What is claimed is:

1. A spray type heat dissipation apparatus, comprising:
a heat sink adapted to absorb heat;
a fan; and
a spraying member comprising a water tank, a water transmitting tube extending from a bottom of the water tank, and a plurality of water output tubes extending upwards from the water transmitting tube; the water tank is configured to accommodate heat-dissipating liquid; the heat-dissipating liquid in the water tank flows out to the plurality of water output tubes via the water transmitting tube; the plurality of water output tubes transforms the heat-dissipating liquid into convex meniscus; the fan atomizes the convex meniscus into a mist of droplets and blows the mist of droplets towards the heat sink; and the fan blow the mist of droplets which have been evaporated out of the heat sink.

2. The spray type heat dissipation apparatus of claim 1, further comprising an enclosure comprising an enclosure base; the heat sink, the fan, and the spraying member are mounted on the enclosure base; and the plurality of water output tubes are located between the fan and the heat sink.

3. The spray type heat dissipation apparatus of claim 2, wherein the fan comprises an air inlet opening and an air outlet opening; the air inlet opening is configured for air flowing into the fan in a direction which is in line with a rotating axle of the fan; the air outlet opening is configured for air flowing out of the fan horizontally; and the air outlet opening is aligned to a first side of the heat sink.

4. The spray type heat dissipation apparatus of claim 3, wherein a plurality of slots are defined in one side of the enclosure base; and a second side of the heat sink is aligned to the plurality of slots.

5. The spray type heat dissipation apparatus of claim 1, further comprising an enclosure base configured to mount a circuit board; and the enclosure comprises a heat pipe configured to transmit heat accumulated on a heat source of the circuit board to the heat sink.

6. The spray type heat dissipation apparatus of claim 5, wherein the fan is configured to be accommodated in a cutout of the circuit board.

7. The spray type heat dissipation apparatus of claim 2, wherein the enclosure further comprises an enclosure cover mounted on the enclosure base; an opening is defined in the enclosure cover; the water tank extends out of the enclosure via the opening; and a first cove panel is located on the opening.

8. The spray type heat dissipation apparatus of claim 7, wherein a second cove panel is located on the water tank.

9. A spray type heat dissipation apparatus, comprising:
an enclosure comprising an enclosure base;
a heat sink mounted on the enclosure base and adapted to absorb heat;
a fan mounted on the enclosure base; and
a spraying member mounted on the enclosure base; wherein the spraying member comprises a water tank, a water transmitting tube extending from a bottom of the water tank, and a plurality of water output tubes extending upwards from the water transmitting tube; the water tank is configured to accommodate heat-dissipating liquid; the heat-dissipating liquid in the water tank flows out to the plurality of water output tubes via the water transmitting tube; the plurality of water output tubes transforms the heat-dissipating liquid into convex meniscus; the fan atomizes the convex meniscus into a mist of droplets and blows the mist of droplets towards the heat sink; and the fan blows the mist of droplets which have been evaporated out of the heat sink.

10. The spray type heat dissipation apparatus of claim 9, wherein the plurality of water output tubes are located between the fan and the heat sink.

11. The spray type heat dissipation apparatus of claim 10, wherein the fan comprises an air inlet opening and an air outlet opening; the air inlet opening is configured for air flowing into the fan in a direction which is in line with a rotating axle of the fan; the air outlet opening is configured for air flowing out of the fan horizontally; and the air outlet opening is aligned to a first side of the heat sink.

12. The spray type heat dissipation apparatus of claim 11, wherein a plurality of slots are defined in one side of the enclosure base; and a second side of the heat sink is aligned to the plurality of slots.

13. The spray type heat dissipation apparatus of claim 9, further comprising an enclosure base configured to mount a circuit board; and the enclosure comprises a heat pipe configured to transmit heat accumulated on a heat source of the circuit board to the heat sink.

14. The spray type heat dissipation apparatus of claim 13, wherein the fan is configured to be accommodated in a cutout of the circuit board.

15. The spray type heat dissipation apparatus of claim 10, wherein the enclosure further comprises an enclosure cover mounted on the enclosure base; an opening is defined in the enclosure cover; the water tank extends out of the enclosure via the opening; and a first cove panel is located on the opening.

16. The spray type heat dissipation apparatus of claim 15, wherein a second cove panel is located on the water tank.

* * * * *